United States Patent
Maehata

[19]

[11] Patent Number: 5,994,034
[45] Date of Patent: Nov. 30, 1999

[54] FABRICATION METHOD OF PRINTED WIRING BOARD

[75] Inventor: Eiji Maehata, Tokyo, Japan

[73] Assignee: NEC Corporation, Tokyo, Japan

[21] Appl. No.: 08/845,037

[22] Filed: Apr. 21, 1997

[30] Foreign Application Priority Data

Apr. 19, 1996 [JP] Japan .................................. 8-122251

[51] Int. Cl.⁶ ..................................................... G03C 5/16
[52] U.S. Cl. ......................... 430/313; 430/315; 430/326; 430/328; 430/330
[58] Field of Search .................................. 430/189, 193, 430/313, 314, 315, 326, 328, 330

[56] References Cited

U.S. PATENT DOCUMENTS 4,943,516  7/1990  Kamayachi et al. ................. 430/280.1

FOREIGN PATENT DOCUMENTS 60-62187   4/1985   Japan .
2-260691  10/1990   Japan .
4-23484    1/1992   Japan .

Primary Examiner—Bernard Codd
Attorney, Agent, or Firm—Sughrue, Mion, Zinn, Macpeak & Seas, PLLC

[57] ABSTRACT

A fabrication method of a printed wiring board realizing high adhesion strength of a patterned conductive layer while keeping the high insulation reliability between adjacent conductive paths. First, an adhesive material is prepared, which is a mixture of a photo-setting resin as a matrix, fine particles of a photolyzable resin dispersed in the photo-setting resin, and a metal-organic compound/complex mixed with the photo-setting resin. The adhesive material is coated on an insulative base material to form an adhesive layer. The adhesive layer is then selectively exposed to light, selectively curing the photo-setting resin and selectively photo-lyzing the particles of the photolyzable resin. The exposed adhesive layer is developed by an alkaline developer solution, thereby transferring the pattern on the mask to the adhesive layer and removing the photolyzed particles for surface roughening of the remaining, unexposed parts of the adhesive layer. The metal-organic compound/complex in the unexposed parts of the adhesive layer is reduced for activation, causing the metal-organic compound/complex to reveal plating catalytic activity. A conductive layer is selectively formed on the unexposed parts of the adhesive layer by electroless plating performed under the plating catalytic activity of the activated metal-organic compound/complex.

11 Claims, 3 Drawing Sheets

FABRICATION METHOD OF PRINTED WIRING BOARD

BACKGROUND OF THE INVENTION

1. Field of the Invention

The present invention relates to a fabrication method of a Printed Wiring Board (PWB) and more particularly, to a fabrication method of a single- or multi-layer PWB that uses the fully-additive process.

2. Description of the Prior Art

In recent years, with electronic equipment such as computers, the component mounting density and the operation speed have been becoming higher and higher. To cope with this tendency, attention has been attracted to the fully-additive process in the fabrication of a PWB, because the conductive paths or circuits are able to be formed on an insulative base material at a higher density than the case where the subtractive process is used.

The "additive process" is a process in which necessary conductive paths or circuits are added onto an insulative base material. Specifically, an insulative base material is used as a substrate and an electroless plating process or an electroplating process is used for conductive pattern formation. This "additive process" is typically applied to the formation of a multilayer PWB including multilevel conductive circuits interconnected by plated through-holes.

The "fully-additive process" is a process in which necessary conductive paths are fully added onto the insulative base material using an electroless plating process only. This process is able to form fine conductive paths having a width of approximately 25 $\mu$m. An example of this process is disclosed in the Japanese Non-Examined Patent Publication No. 60-62187 published in April 1985.

The conventional fabrication methods of a PWB using the "fully-additive process" are applicable to the formation of high-density conductive patterns or paths. However, they have a problem in that the insulation reliability between the adjacent conductive patterns or paths is not satisfactory.

To solve the problem due to insulation reliability, various improved methods have been developed and disclosed, examples of which are disclosed in the Japanese Non-Examined Patent Publication Nos. 2-260691 published in October 1990 and 4-23484 published in January 1992.

In the conventional improved methods disclosed in the Japanese Non-Examined Patent Publication Nos. 2-260691 and 4-23484, a photosensitive resin compound into which particles of a plating catalyst are blended is prepared. Next, a wanted, patterned resin layer is formed onto an insulative base material by the resin compound thus prepared. Subsequently, a conductive layer is selectively deposited onto the patterned photosensitive resin layer by an electroless plating process, thereby forming conductive paths or circuits on the base material.

In these conventional methods, since the catalyst particles are blended into the photosensitive resin compound, no catalyst particles are left on the base material between the adjacent conductive paths on the patterned resin layer even for the high-density circuit patterns. As a result, the above problem relating to the insulation reliability can be solved.

However, the conventional improved methods disclosed in the Japanese Non-Examined Patent Publication Nos. 2-260691 and 4-23484 have a problem relating to the process for realizing a wanted adhesion strength between the patterned photosensitive resin layer and the conductive layer deposited thereon.

Specifically, with the conventional improved method disclosed in the Japanese Non-Examined Patent Publication No. 2-260691, the layer of the photosensitive resin compound is formed on the base material by a coating process and then, it is subjected to an optical exposure process using a photomask. Then, the optically exposed layer of the photosensitive resin compound is developed with the use of a developer solution, thereby removing its unexposed parts and surface-roughening its exposed parts.

However, the conventional improved method disclosed in the Japanese Non-Examined Patent Publication No. 2-260691 has problems as described below.

First, the exposure condition for chemically corroding the exposed parts of the photosensitive resin layer is very difficult to control.

Second, the photosensitive resin compound coated on the base material, which is in a half-cured state, tends to dissolve into a plating solution during the subsequent electroless plating process. The dissolved resin is included in the plated conductive layer, thereby degrading the property of the plated conductive layer.

Third, to provide the required surface-roughening effect, the developer solution needs to contain some regulated solvent such as chloroform, and trichloroethylene. This makes it difficult to apply this conventional method to practical use.

In the conventional improved method disclosed in the Japanese Non-Examined Patent Publication No. 4-23484, it is described that the conductive layer is deposited onto the underlying, patterned photosensitive resin layer with a satisfactory adhesion strength. However, no practical process realizing such the strength is explained therein.

Typically, the adhesion strength obtained by the conventional improved method of the Japanese Non-Examined Patent Publication No. 4-23484 will be at most approximately 0.1 kg/cm or less. This value of the adhesion strength is far from the required value.

SUMMARY OF THE INVENTION

Accordingly, an object of the present invention is to provide a fabrication method of a PWB that makes it possible to realize a high adhesion strength of a patterned conductive layer while keeping the high insulation reliability between adjacent conductive paths formed by the patterned conductive layer.

Another object of the present invention is to provide a fabrication method of a PWB that is able to fabricate a PWB without occurring any environmental problems.

Still another object of the present invention is to provide a fabrication method of a PWB that is capable of low-cost fabrication.

A further object of the present invention is to provide a fabrication method of a PWB that causes no degradation of a patterned conductive layer.

A fabrication method of a PWB according to the present invention includes the following steps:

First, an adhesive material is prepared. The adhesive material is a mixture of a photo-setting resin as a matrix, fine particles of a photolyzable resin dispersed in the photo-setting resin, and a metal-organic compound or complex mixed with the photo-setting resin.

Second, the adhesive material is coated on an insulative base material to form an adhesive layer.

Third, the adhesive layer is selectively exposed to light using a mask with a pattern, thereby selectively curing the photo-setting resin contained in the adhesive layer and selectively photolyzing the particles of the photolyzable resin contained in the adhesive layer.

Fourth, the exposed adhesive layer is developed by an alkaline developer solution to selectively remove exposed or cured parts of the adhesive layer, thereby transferring the pattern on the mask to the adhesive layer and removing the photolyzed particles for surface roughening of the remaining, unexposed parts of the adhesive layer.

Fifth, the metal-organic compound or complex contained in the remaining, unexposed parts of the adhesive layer is reduced to activate the metal-organic compound or complex, thereby causing the metal-organic compound or complex to reveal plating catalytic activity.

Sixth, a conductive layer is selectively formed on the remaining, unexposed parts of the adhesive layer by an electroless plating process of a conductive material. The plating process is performed under the plating catalytic activity of the activated metal-organic compound or complex.

With the fabrication method of a PWB according to the present invention, during the third step of optical exposure, the particles of the photolyzable resin contained in the adhesive layer are photolyzed. Also, during the fourth step of development, the photolyzed particles of the photolyzable resin contained in the adhesive layer are removed for the purpose of surface-roughening of the unexposed parts of the adhesive layer. This means that the surface or contact area of the adhesive layer is expanded.

Further, the metal-organic compound or complex contained in the unexposed parts of the adhesive layer is activated by reduction, thereby causing the metal-organic compound or complex to reveal plating catalytic activity. The conductive layer is selectively formed on the unexposed parts of the adhesive layer in the sixth step by the electroless plating process under the plating catalytic activity of the activated metal-organic compound or complex.

Accordingly, a high adhesion strength of the patterned conductive layer to the underlying adhesive layer can be realized while keeping the high insulation reliability between the adjacent conductive paths.

Also, the fourth step of development is performed by using the alkaline developer solution without the use of regulated solvent such as chloroform, and trichloroethylene. Therefore, a PWB is able to be fabricated without occurring any environmental problems. This means that popular production lines may be used and, as a result, a PWB may be fabricated at a low cost.

The adhesive layer is developed after the third step of optical exposure or curing, thereby removing the exposed parts of the adhesive layer. Therefore, if the remaining, unexposed parts of the adhesive layer are fully cured prior to the sixth step of plating, no degradation of the patterned conductive layer will occur.

If the photo-setting resin is partially cured, it is preferred that the photo-setting resin is fully cured due to exposure to heat or light in a subsequent process.

The insulative base material may have a patterned, inner conductive layer forming an inner circuit. In other words, the insulative base material may have a single- or multi-layer structure. The insulative base material may be rigid or flexible.

In the present invention, as the photo-setting resin, any resin may be used if it has a photo-setting property. Preferably, at least one of photosensitive epoxy resin, photosensitive polyimide resin, photosensitive epoxy acrylate resin, photosensitive epoxy methacrylate resin, and photosensitive urethane acrylate resin may be used.

Typically, ultraviolet (UV) light is used as the exposing light. However, any other light may be used as necessary.

It is not required that the photo-setting resin is fully cured due to only the optical exposure during the third step. The photo-setting resin may be fully cured during a subsequent, additional curing process by heat or light. If heat is used for curing, it is necessary that the photo-setting resin has a thermosetting property, or the adhesive material contains any thermosetting or heat-curing resin, and that any heating process is added after the third step.

As the thermosetting or heat-curing resin, any photosensitive resin having at least one thermosetting functional group may be used. For example, thermosetting epoxy resin, or thermosetting polyimide resin is preferably used.

As the photolyzable resin, any resin may be used if it has photolyzable property.

The fine particles of the photolyzable resin may be produced by any process. For example, the particles may be directly produced from a liquid of the photolyzable resin by using a known sol-gel process, or they may be produced through a milling process from a solid of the photolyzable resin by using a jet mil or the like.

A preferred diameter distribution of the fine particles of the photolyzable resin is a distribution having the reference or central diameter of 3 to 5 $\mu$m. If the reference diameter is smaller than 3 $\mu$m, an obtainable surface roughness formed by the removal of the fine particles does not generate a satisfactory anchoring effect. If the reference diameter is larger than 5 $\mu$m, a surface roughness to be formed by the removal of the fine particles has an excessive depth, which is not proper for the formation of fine circuit patterns.

As the metal-organic compound or complex, any one of organic palladium compounds or complexes is preferably used, because they have a good dispersibility to the photo-setting resin, and a good plating catalytic activity. For example, palladium acetate is suitable.

It is preferred that the composition of the metal-organic compound or complex is 5 to 10 weight % with respect to the photo-setting resin. If the composition of the metal-organic compound or complex is lower than 5 weight %, a satisfactory plating catalytic activity is not provided. If the composition of the metal-organic compound or complex is higher than 10 weight %, an unwanted effect will occur due to the excessive metal-organic compound or complex.

The adhesive material may contain fine particles of a suitable filler such as silica, a coupling agent, a stabilizing agent, or the like as an additive, as necessary.

As the alkaline developer solution, any alkaline developer solution may be used if it is capable of the pattern transfer and the surface roughening.

Any reducing agent may be used for the fifth step of reduction of the unexposed parts of the adhesive layer.

Any electroless plating process may be used for the sixth step of the formation of the conductive layer.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1A:
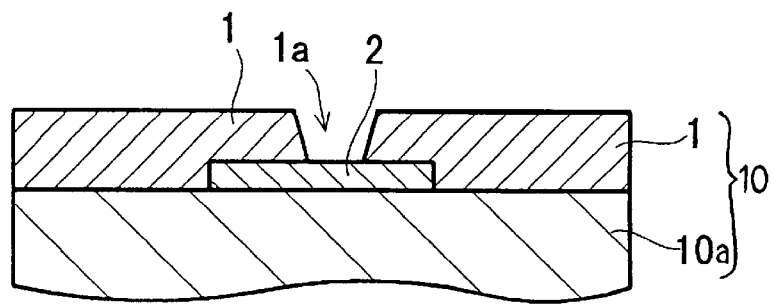
FIGS. 1A to 1E are partial cross-sectional views showing a fabrication method of a multilayer PWB according to a first embodiment of the present invention, respectively.

Preferred embodiments of the present invention will be described below referring to the drawings attached.

FIRST EMBODIMENT

In a fabrication method of a PWB according to a first embodiment, first, an insulative base material 10 is prepared. The material 10 has, as shown in FIG. 1A, an inner structure 10a, an inner circuit layer 2 formed on a surface of the inner structure 10a, and an insulating layer 1 formed on the surface of the inner structure 10a to cover the inner circuit layer 2. A via hole 1a is formed in the insulating film 1 to extend to the underlying inner circuit layer 2.

The state at this stage is shown in FIG. 1A.

On the other hand, an adhesive material is prepared in the following way:

A UV-setting resin is obtained by mixing (a) a bisphenol-A-type epoxy resin (Epoxy Equivalent per Weight is 3000 to 4000, "KAYARADDO R-167" produced by YUKA-SHELL EPOXY CO. LTD.) of 20 weight %, (b) a nonylphenoxy polyprene glycol acrylate ("ALONICKS M-117" produced by TOA GOSEI LTD.) of 50 weight %, (c) a benzyldimethalquetile ("IRUGACURE 651" produced by CIBA-GEIGY LTD.) of 2 weight % serving as an initiating agent, (d) a benzophenone of 2 weight %, and (e) an N-methyl ethanol amine of 3 weight % serving as a polymerization regulator.

A photolyzable resin is produced by mixing a naphthoquinone diazide compound and a cresol novolac resin with each other.

Fine particles 4 of the photolyzable resin thus produced are generated by a known process. The diameter distribution of the particles is set as a distribution where the reference diameter is 5 $\mu$m. The particles of the photolyzable resin of 20 weight % are mixed with the above-described UV-setting resin.

As a metal-organic compound, palladium acrylate of 10 weight % is mixed with the above-described UV-setting resin.

Thus, an insulative adhesive material containing the UV-setting resin as a matrix, the fine particles of the photolyzable resin dispersed in the UV-setting resin, and the metal-organic compound is prepared.

Figure 1B:
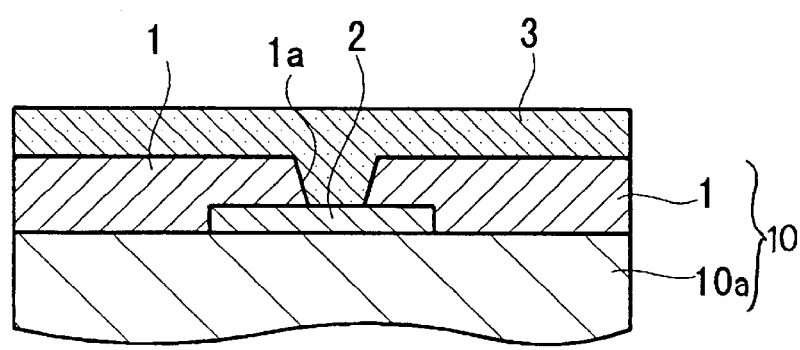

Next, the adhesive material thus prepared is coated on the insulating layer 1 by a screen printing process, as shown in FIG. 1B, thereby forming an adhesive layer 3. The layer 3 is contacted with the underlyiny inner circuit layer 2 through the via hole 1a.

The coated adhesive layer 3 is then dried with the use of an air-heating furnace at a temperature of 80° C. for 20 minutes. Thus, the dried adhesive layer 3 has a thickness of approximately 10 $\mu$m. The state at this stage is shown in FIG. 1B.

This coating process may be performed any one of the known processes such as screen coating, curtain coating, roll coating, spray coating processes, or the like.

Figure 1C:
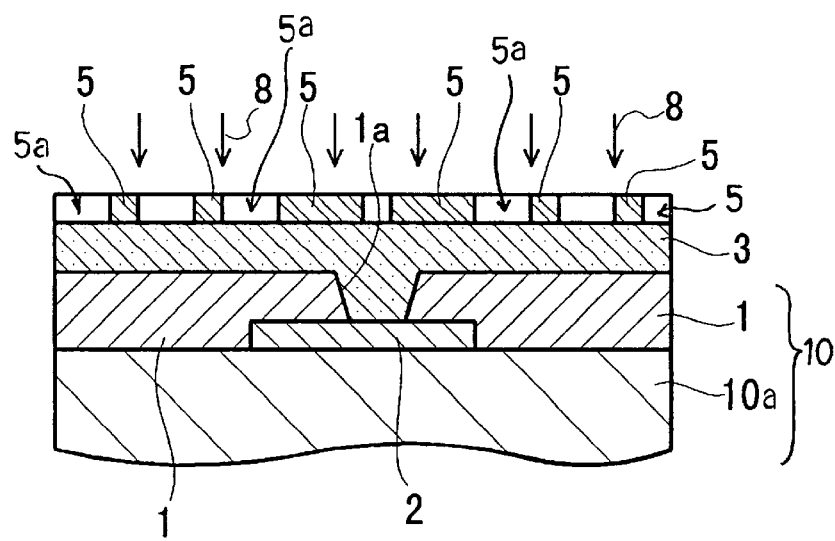

Following this process, as shown in FIG. 1C, a negative-type photomask 5 with a specific pattern is placed on the adhesive layer 3. The photomask 5 has penetrating windows 5a corresponding to the specific pattern.

Then, UV light 8 is selectively irradiated to the adhesive layer 3 through the photomask 5 at an illumination of approximately 1000 mJ/cm$^2$ by an ultra-high-pressure mercury-vapor lamp. Thus, the exposed parts of the adhesive layer 3 are cured and the unexposed parts thereof are kept uncured.

After stripping the photomask 5, the UV-exposed adhesive layer 3 is developed by using an alkaline developer solution. Here, the developer solution is a water solution of 1%-sodium carbonate. During this development process, as shown in FIG. 1D, the exposed parts of the adhesive layer 3 are removed and the unexposed parts thereof are left, thereby forming an outer circuit layer 6.

Figure 1D:
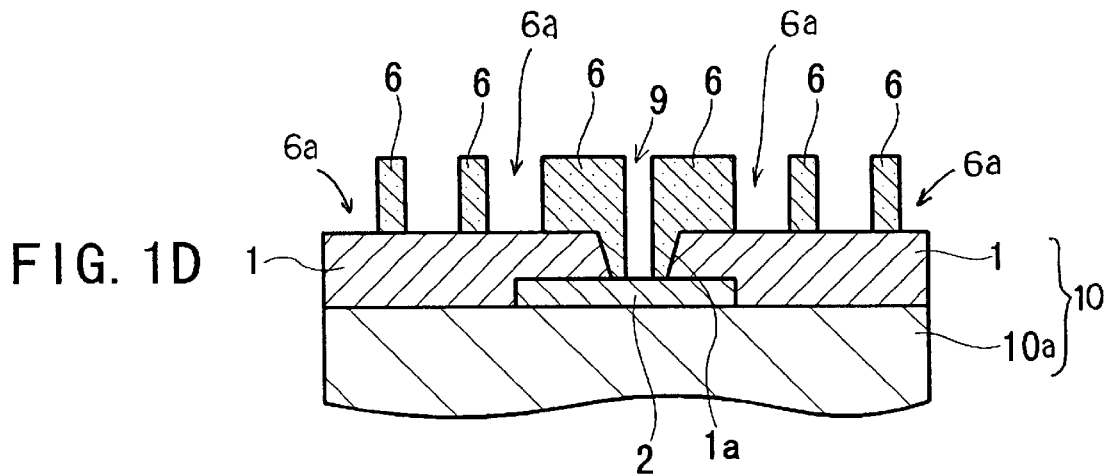

The outer circuit layer 6 has penetrating windows 6a at locations corresponding to the windows 5a of the photomask 5 and a contact via hole 9 at a location over the inner circuit layer 2, as shown in FIG. 1D.

Figure 2A:
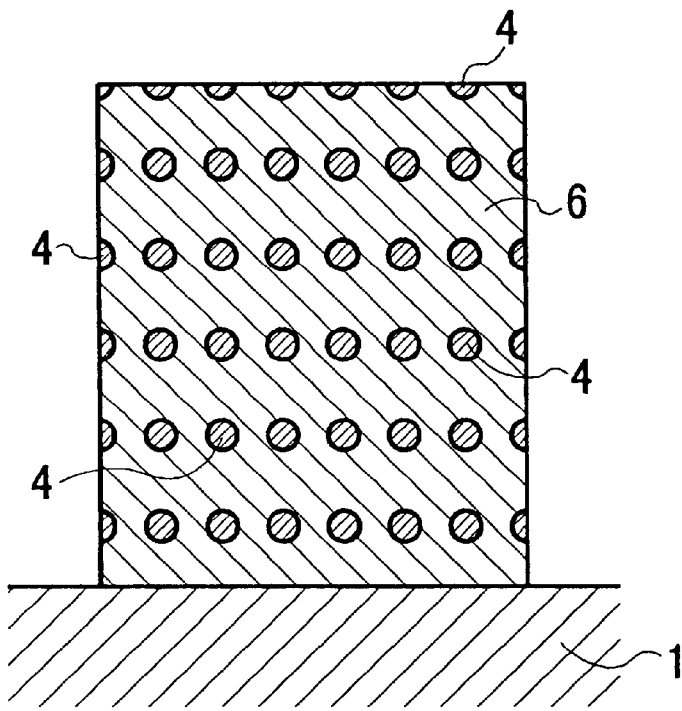
FIG. 2A is a partial cross-sectional view of the adhesive layer formed on the insulating layer in the fabrication method according to the first embodiment, where the fine particles of the photolyzable resin are not removed from the adhesive layer.
Figure 2B:
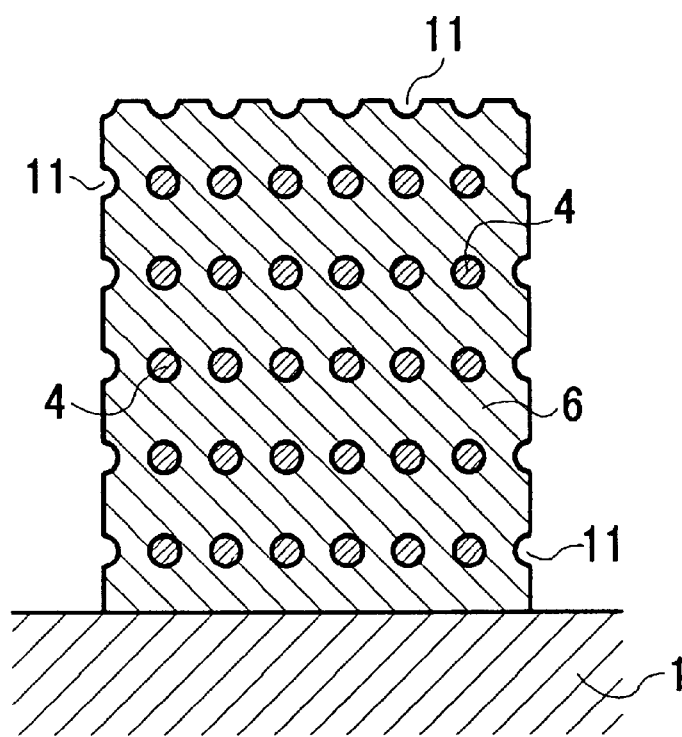
FIG. 2B is a partial cross-sectional view of the adhesive layer formed on the insulating layer in the fabrication method according to the first embodiment, where the fine particles of the photolyzable resin are removed from the adhesive layer to generate the surface roughening.

During the development process, the fine particles 4 of the photolyzable resin-distributed within the coated adhesive layer 3 as shown in FIG. 2A are removed near the surface of the outer circuit layer 6, thereby forming fine dimples 11, as shown in FIG. 2B. Thus, the surface of the outer circuit layer 6 is roughened and as a result, the contact area of the layer 6 is increased.

Following this step, the outer circuit layer 6 formed by the patterned adhesive layer 3 is subjected to a heat treatment at a temperature of 140° C. for 30 minutes, thereby fully curing the remaining adhesive layer 3.

The assembly of the base material 10, the inner circuit layer 2, the insulating layer 1, and the outer circuit layer 6 is dipped into an alkaline degreasing solution at a temperature of 75° C. for five minutes, and then, it is cleaned by water.

The assembly is then dipped into a solution of 5%-sodium hypophosphite at a temperature of 70° C. for one minutes, thereby reducing the palladium acrylate contained in the outer circuit layer 6. Thus, the palladium acrylate is activated to reveal plating catalytic activity.

Finally, the assembly is dipped into an electroless copper (Cu) plating solution at a temperature of 70° C. for 10 hours, thereby selectively forming a plated copper layer 7 with a thickness of approximately 20 $\mu$m on the outer circuit layer 6. The copper layer 7 is contacted with and electrically connected to the underlying inner circuit layer 2 through the via hole 9.

Figure 1E:
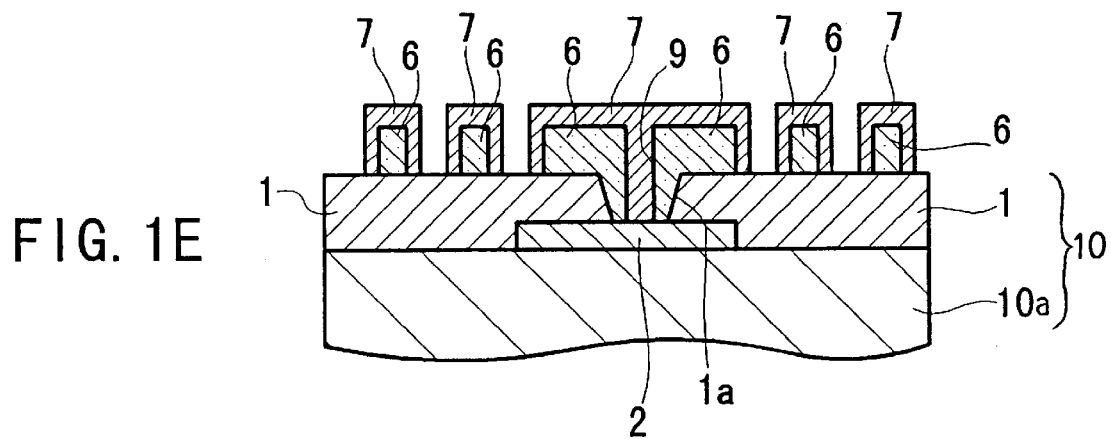

Thus, the multilayer PWB as shown in FIG. 1E is fabricated.

As described above, with the fabrication method of a PWB according to the first embodiment, during the optical exposure step of the adhesive layer 3 as shown in FIG. 1C, the particles 11 of the photolyzable resin contained in the adhesive layer 3 are photolyzed. Also, during the development step of the UV-exposed adhesive layer 3, the photolyzed particles 11 of the photolyzable resin contained in the adhesive layer 3 are removed for the purpose of surface-roughening of the unexposed parts of the adhesive layer 3. This means that the surface or contact area of the adhesive layer 3 is expanded.

Further, the metal-organic compound (i.e., palladium acrylate) contained in the unexposed parts of the adhesive layer 3 is activated by reduction, thereby causing the metal-organic compound to reveal plating catalytic activity. The conductive copper layer 7 is selectively formed on the unexposed parts of the adhesive layer 3 (i.e., the outer circuit 6) during the electroless plating process under the plating catalytic activity of the activated metal-organic compound.

Accordingly, a high adhesion strength of the patterned conductive layer 7 to the underlying adhesive layer 3 can be realized while keeping the high insulation reliability between the adjacent conductive paths.

Also, the development step is performed by using alkaline developer solution without the use of regulated solvent such as chloroform, and trichloroethylene. Therefore, the PWB is able to be fabricated without occurring any environmental problems. This means that popular production lines may be used and as a result, the PWB may be fabricated at a low cost.

The adhesive layer 3 is developed after the optical exposure or curing step, thereby removing the exposed parts of the adhesive layer 3. Therefore, if the remaining, unexposed parts of the adhesive layer 3 are fully cured prior to the plating step, no degradation of the patterned conductive layer 7 will occur.

SECOND EMBODIMENT

In a fabrication method of a PWB according to a second embodiment, the same process steps are performed as those in the first embodiment except that the adhesive material has a different composition. Therefore, the description relating to the same process steps are omitted here for the sake of brevity.

In the second embodiment, the adhesive material is prepared in the following way:

A UV-setting resin was obtained by mixing (a) a bisphenol-F-type epoxy resin (Epoxy Equivalent per Weight is 3000 to 4000, "KAYARADDO R-167" produced BY YUKA-SHELL EPOXY CO. LTD.) of 25 weight %, (b) a nonylphenoxy polyprene glycol acrylate ("ALONICKS M-117" produced by TOA GOSEI LTD.) of 50 weight %, (c) a benzyldimethalquetile ("IRUGACURE 651" produced by CIBA-GEIGY LTD.) of 2 weight % serving as an initiating agent, (d) a benzophenone of 2 weight %, and (e) an N-methylethanolamine of 3 weight % serving as a polymerization regulator.

A photolyzable resin is produced by a naphthoquinone diazide compound and a cresol novolac resin. Fine particles of the photolyzable resin thus produced are generated by a known process. The particles 4 of the photolyzable resin of 20 weight % are mixed with the above-described UV-setting resin.

As a metal-organic compound, palladium acrylate of 10 weight % is mixed with the above-described UV-setting resin.

Further, silica particles are added to the mixture at 10 weight %.

With the fabrication method of a PWB according to the second embodiment, in addition to the same advantages as those in the first embodiment, the adhesive layer 3 (i.e., the outer circuit layer 6) can be improved in the mechanically processing performance, the heat resistance, and so on, because of the addition of the filler such as silica.

Any other filler such as barium sulfate, talc, or the like may be used as necessary.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a printed wiring board, said method comprising the steps of:

(a) preparing an adhesive material;
   said adhesive material being a mixture of a photo-setting resin as a matrix, particles of a photolyzable resin dispersed in said photo-setting resin, and a metal-organic compound or complex mixed with said photo-setting resin;

(b) coating said adhesive material on an insulative base material to form an adhesive layer;

(c) selectively exposing said adhesive layer to light using a mask with a pattern, thereby selectively curing said photo-setting resin contained in said adhesive layer and selectively photolyzing said particles of said photolyzable resin contained in said adhesive layer;

(d) developing said exposed adhesive layer by an alkaline developer solution to selectively remove the exposed or cured parts of said adhesive layer, thereby transferring said pattern on said mask to said adhesive layer and removing said photolyzed particles to roughen the surface of the unexposed parts of said adhesive layer;

(e) reducing said metal-organic compound or complex contained in the unexposed parts of said adhesive layer to activate said metal-organic compound or complex, thereby causing said metal-organic compound or complex to reveal plating catalytic activity; and (f) selectively forming a conductive layer on the unexposed parts of said adhesive layer by an electroless plating process of a conductive material;
   said plating process being performed under the plating catalytic activity of said activated metal-organic compound or complex.

2. The method as claimed in claim 1, wherein said photo-setting resin is fully cured due to exposure to heat or light in a process subsequent to step (c).

3. The method as claimed in claim 2, wherein said photo-setting resin has a thermosetting property.

4. The method as claimed in claim 2, wherein said adhesive material contains a thermosetting resin.

5. The method as claimed in claim 1, wherein the diameter distribution of said fine particles of said photolyzable resin is a distribution having the reference diameter of 3 to 5 $\mu$m.

6. The method as claimed in claim 1, wherein said metal-organic compound or complex is an organic palladium compound or complex.

7. The method as claimed in claim 6, wherein said metal-organic compound or complex is palladium acetate.

8. The method as claimed in claim 1, wherein the composition of said metal-organic compound or complex is 5 to 10 weight % with respect to said photo-setting resin.

9. The method as claimed in claim 1, wherein said adhesive material contains particles of a filler.

10. The method as claimed in claim 9, wherein said adhesive material contains particles of silica.

11. The method as claimed in claim 1, wherein said photo-setting resin is fully cured prior to the electroless plating step (f).

* * * * *